United States Patent [19]

Shackleford

[11] Patent Number: 5,761,077
[45] Date of Patent: Jun. 2, 1998

[54] GRAPH PARTITIONING ENGINE BASED ON PROGRAMMABLE GATE ARRAYS

[75] Inventor: J. Barry Shackleford, Tokyo, Japan

[73] Assignee: Hewlett-Packard Company, Palo Alto, Calif.

[21] Appl. No.: 447,469

[22] Filed: May 23, 1995

[51] Int. Cl.$^6$ .................................................. G06F 17/50
[52] U.S. Cl. ........................ 364/489; 364/490; 364/491; 364/488
[58] Field of Search .................................. 364/488–491, 364/578; 326/41; 395/500

[56] References Cited

U.S. PATENT DOCUMENTS

| | | | |
|---|---|---|---|
| 5,224,056 | 6/1993 | Chene et al. | 364/490 |
| 5,455,525 | 10/1995 | Ho et al. | 326/41 |
| 5,675,500 | 10/1997 | Kung et al. | 364/490 |

OTHER PUBLICATIONS

Hsu et al. "Combining Logic Minization and Folding for PLA's," IEEE, pp. 706–713, Jun. 1991.
Liu et al. "An Efficient Algorithm for Selecting Bipartite Row or Column Folding of Programmable Logic Arrays," IEEE, pp. 494–498, Jul. 1994.
Tragoudas et al. "An Improved Algorithm for the Generation Min–Cut Partitioning Problem," IEEE, pp. 242–247, Mar. 1994.
Unaltuna et al. "A Stochastic Reward and Punishment Neural Network Algorithm for Circuit Bipartitioning," IEEE, pp. 181–184, Jun. 1994.
Shi et al. "Circuit Partitioning Under Capacity and I/O Constraints," IEEE, pp. 659–685, May 1994.
Saarinen et al. "vLSI Implementation of Tausworthe Random Number Generator for Parallel Processing Environment," IEEE, pp. 138–146, May 1991.
Cong et al. "Net Partitions Yield Better Module Partitions," IEEE, pp. 47–52, Jun. 1992.
Park et al. "An Efficient Algorithm for VLSI Network Partitioning Problem Using a Cost Function With Balancing Factor," IEEE, pp. 1686–1694, Nov. 1993.
Lee et al. "An Efficient K–Way Graph Partitioning Algorithm for Task Allocation in Parallel Computing Systems," IEEE, pp. 748–751, Apr. 1990.
Gopalakrishnan Vijayan "Generalization of Min–Cut Partioning to Tree Structures and its Applications," IEEE, pp. 307–314, Mar. 1991.

Primary Examiner—Emanuel Todd Voeltz
Assistant Examiner—Vuthe Siek

[57] ABSTRACT

A method for operating a FPGA to compute a function whose optimum represents the preferred partitioning of a graph having a plurality of vertices connected by edges. The FPGA is configured to provide a partition state register having a plurality of cells. Each cell corresponds to one of the vertices in the graph and is used to store a number indicative of the partition to which the corresponding vertex is currently assigned. The algorithm for determining the optimum partition computes a cost function having two components. The assignment of the vertices to the various partitions is made such that this cost function is minimized. For any given assignment of the vertices, the FPGA computes the cost function using two circuits that are configured from the FPGA. The first circuit computes the number of edges that connect vertices belonging to different partitions. The second circuit computes a number that represents the extent to which the various partitions differ from one another in size. The ideal partitioning is that which minimizes a weighted sum of these computed numbers. Special circuits for generating random numbers and binary vectors having a controllable number of randomly placed ones therein are also described.

9 Claims, 7 Drawing Sheets

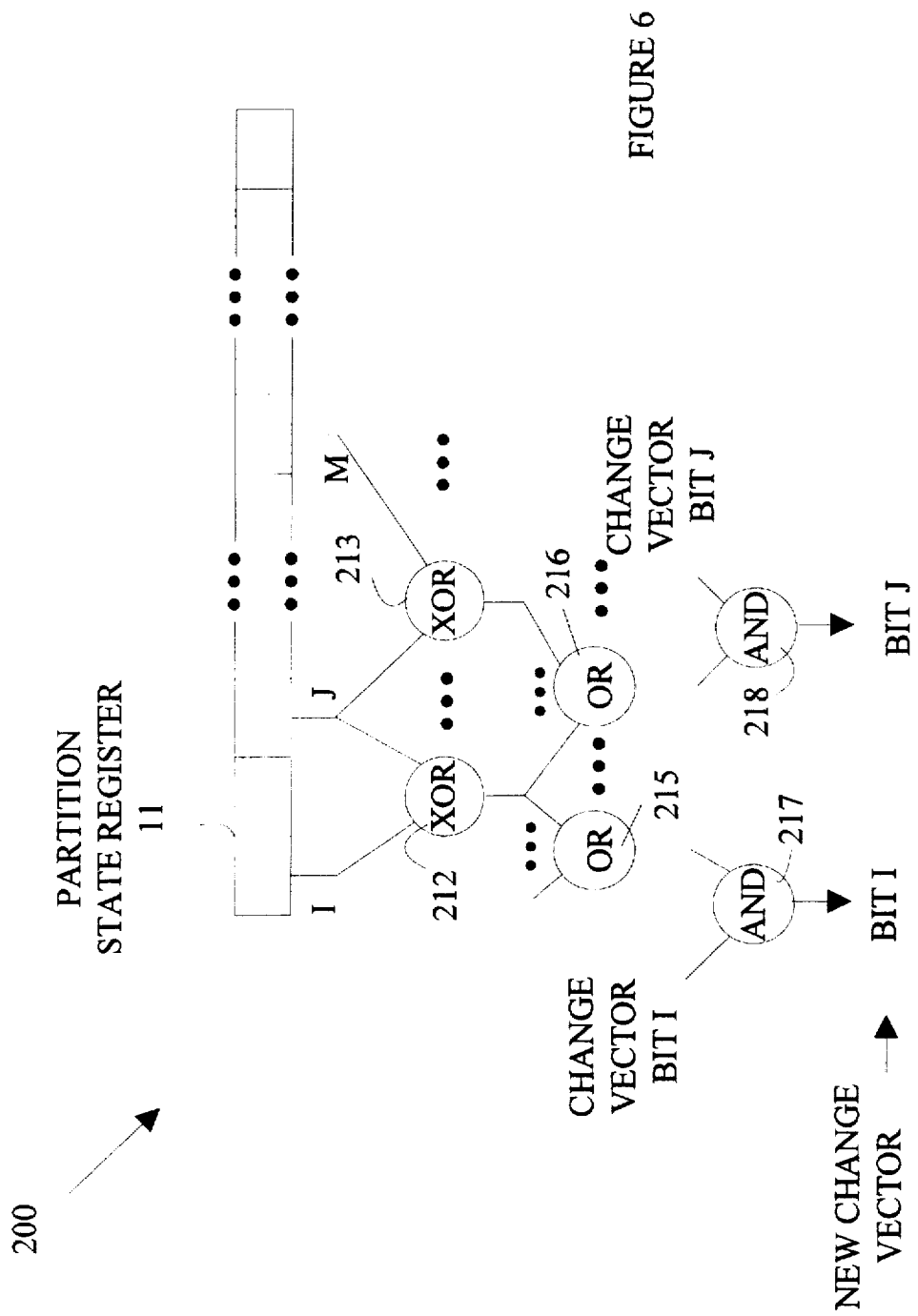

GRAPH PARTITIONING ENGINE BASED ON PROGRAMMABLE GATE ARRAYS

FIELD OF THE INVENTION

The present invention relates to computers and more particularly, to the field programmable gate arrays to solve graph partitioning problems.

BACKGROUND OF THE INVENTION

For the purposes of this discussion, programmable logic is defined to be digital circuitry of fixed connectivity that can be configured by a user to emulate other digital systems of arbitrary topologies at high speed. It can be used to create high speed logic simulators as well as configurable compute engines capable of outperforming supercomputers at certain tasks for a fraction of the cost. Programmable logic systems capable of emulating large digital circuits (with hundreds of thousands of gates) are expensive, typically costing on the order of two to four dollars per emulated gate, and require a large number of integrated circuits distributed across multiple, complex printed circuit boards.

One class of programmable logic is based on the Field Programmable Gate Array (FPGA) technology. This approach utilizes a number of FPGAs connected together in a fixed topology. Each FPGA includes two types of resources: (1) a number of programmable logic cells (PLCs) which can be programmed or configured to perform a specific logic function (such as "AND" or "EXCLUSIVE OR"); and (2) routing resources which can be programmed to interconnect the logic cells with each other and with external input/output pins. The programmed FPGA thus forms a useful logic circuit which is a subset of the entire logic system to be simulated; the entire set of FPGAs taken together then functionally simulate the desired logic system. Since the FPGAs in these architectures have fixed physical connections among them that cannot be altered, simulating a logic system requires a mapping of the circuit for the logic system of interest onto the interconnected FPGAs such that the logic functions and interconnections of the original circuit are precisely represented by the programming of the FPGAs. High speed simulation is possible since the logic cells within the FPGAs perform their computations in parallel, communicating their results with each other through the routing network.

The potential speed of an FPGA based computer has led to a class of reconfigurable computers that adapt their architecture to fit the problem to be solved. Even though the machine cycle time of such computers may be one or two orders of magnitude slower than high-performance conventional workstations, the ability to exploit the implicit parallelism of many problems results in substantial performance gains of several orders of magnitude when compared to a conventional computer.

One class of problems that has the potential of benefiting from the use of FPGA based computers is that of graph partitioning. A graph is a collection of vertices connected to each other by edges. A number of problems may be reduced to finding a partitioning of the vertices of a graph which minimizes the number of edges crossing between partitions.

For example, an integrated circuit can be represented as a graph in which the vertices correspond to the circuit components and the edges correspond to the connections between the various components. Consider an integrated circuit which is too large to fit on a single chip, and hence, must be constructed from a set of two chips. Since the cost of connections between the chips is quite high, the designer wishes to minimize the number of connections. The problem facing the designer is to find a division, i.e., partitioning, of the circuit components into two groups of roughly equal size with the minimum number of connections, i.e., edges, between the two groups.

For any given partitioning of the vertices, a cost function can be generated that depends on the number of edges cut by the partitioning and the degree to which the partitions are similar in size. The problem is then reduced to finding the minimum of this cost function over the set of all possible partitions. For a large graph, the set of all possible partitions is astronomically large; hence, some method of exploring the possible solutions is required.

One technique that is commonly used in solving optimization problems of this type is referred to as simulated annealing. The technique assumes that the surface being searched is basically smooth, but may have a number of local minima. In the beginning, points are picked at random over the entire range of possible solutions. As better estimates are obtained with respect to the regions of the possible solutions that actually contain the minimum, the search area is restricted to an ever decreasing region around the best solution found to date.

In terms of the graph problem, the technique may be stated more precisely as follows. At the onset, a random initial partition is selected. This partition becomes both the current optimum solution and the current working solution. Using the current working solution, vertices are randomly moved between partitions. A new cost is evaluated. If the working solution has a cost that is equal to, or lower than, the current optimum, the working solution becomes the current optimum solution. If the cost is higher than the current optimum but the solution is within a specified range of the current optimum, the new solution becomes the current working solution. This causes the algorithm to explore the solution space in the neighborhood of the current optimum so that it can "climb out of local minima".

Broadly, it is the object of the present invention to provide an improved method of using FPGA based computers for solving graph partitioning problems.

It is a further object of the present invention to provide a method for configuring an FPGA based computer to generate random partitions of a graph.

It is yet another object of the present invention to provide a mapping of a graph partitioning cost function onto an FPGA based computer.

These and other objects of the present invention will become apparent to those skilled in the art from the following detailed description of the invention and the accompanying drawings.

SUMMARY OF THE INVENTION

The present invention comprises a method for operating an FPGA to compute a function whose optimum represents the preferred partitioning of a graph having a plurality of vertices connected by edges. In the preferred embodiment of the present invention, the FPGA is configured to provide a partition state register having a plurality of cells. Each cell corresponds to one of the vertices in the graph and is used to store a number indicative of the partition to which the corresponding vertex is currently assigned. The algorithm for determining the optimum partition computes a cost function having two components. The assignment of the vertices to the various partitions is made such that this cost function is minimized. For any given assignment of the vertices, the FPGA computes the cost function using two circuits that are configured from the FPGA. The first circuit computes the number of edges that connect vertices belonging to different partitions. The second circuit computes a number that represents the extent to which the various partitions differ from one another in size. The ideal partitioning is that which minimizes a weighted sum of these computed numbers.

To improve the speed at which a computer utilizing a FPGA configured to compute the two "costs" described above can explore the various possible partition solutions, the preferred embodiment of the present invention utilizes a special circuit that computes a binary "state change" vector having a small number of ones randomly disbursed therein. Each one represents a vertex whose partition assignment is to be changed in the next iteration of the search algorithm. To improve the efficiency of the search those ones that correspond to vertices that are not on the boundary of partition are masked using another circuit that is configured from the FPGA.

The preferred state change vector generating circuit utilizes two shift registers that are fed by a random number generator. The present invention utilizes a random number generator that has a special feedback system for reducing the number of symmetric patterns generated thereby.

BRIEF DESCRIPTION OF THE DRAWINGS

FIG. 6 is a schematic drawing of a circuit for masking the bits of the partition change vector that would otherwise lead to a trial solution that was not on the boundary of a partition.

DETAILED DESCRIPTION OF THE INVENTION

For a specific graph, the vertices may be represented by entries in a large register that will be referred to as the partition state register (PSR). If the graph has N vertices that are to be partitioned into k partitions, the PSR would have N cells, each cell having [$\log_2 k$ bits]. The value in each cell is the number of the partition to which that vertex is currently assigned. The solution to the partition problem is preferably accomplished with two PSRS, one for the current optimum solution and one for the current working solution.

For any given partition, the computer must determine the "cost" of the partition. In the present invention, the cost is determined in a single machine cycle via logic cells that are connected to the various cells in the PSR that hold the current working solution. As will be explained in more detail below, the specific logic circuit connections depend on which edges are present in the graph being partitioned. The partition cost is determined by two component costs, the cost penalty representing the number of edges that are cut and the cost penalty representing the imbalance between the partition sizes.

In the simplest form, the two component costs are weighted equally; however, it will be apparent to those skilled in the art that that other weighting arrangements may be utilized. For example, in partitioning a netlist into two integrated circuits, minimizing the I/O pins may be more valuable than having two equal-sized circuits. In this case, more weight would be given to the cutsize component.

The cutsize component of the cost is the number of edges that connect vertices in different partitions. C is given by $$C = \sum_{i=1}^{n} \sum_{j>i}^{n} E_{ij} P_{ij}$$

where n is the number of vertices, $E_{ij}$ is 1 if vertices i and j are connected by an edge and 0 otherwise, and $P_{ij}$ is the partition crossing function which is 1 if vertices i and j are in different partitions and 0 otherwise.

The imbalance component of the cost, B, is the sum for all partitions of their deviation from the ideal partition size. In the preferred embodiment of the present invention, B is given by $$B = \sum_{i=1}^{k} \left| \frac{n}{k} - \sum_{j=1}^{n} M_{ij} \right|$$

where k is the number of partitions, and $M_{ij}$ is 1 if vertex j is a member of partition i.

Figure 1:
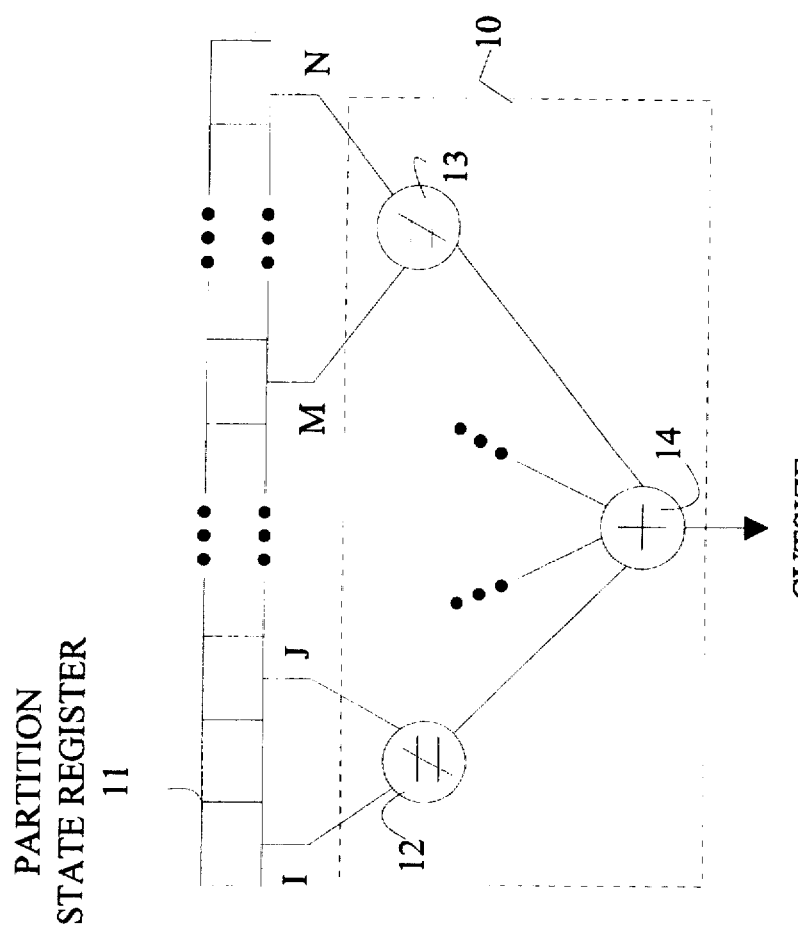
FIG. 1 is a schematic drawing of a cutsize calculating circuit according to the present invention.

The manner in which the cost function computation is mapped on the FPGA will now be discussed in more detail with reference to FIG. 1 which illustrates a cost function circuit 10. Each cell in the PSR 11 will contain a number from 0 to k–1, where k is the number of partitions. If the graph has an edge connecting the $I^{th}$ and $j^{th}$ vertices, the inputs of a comparator are connected to the $I^{th}$ and $J^{th}$ cells of the PSR as shown in FIG. 1 at 12. There will be one such comparator for each pair of vertices that are connected by an edge. A second comparator corresponding to the $M^{th}$ and $N^{th}$ vertices is shown at 13. The outputs of the comparators will be 1 if its two inputs are not equal and 0 otherwise. Hence, the cutsize cost function is the sum of the outputs of all the comparator circuits. This sum is computed by carry save adder 14. In the case in which k=2, the comparator circuits may be replaced by exclusive-OR circuits.

The preferred hardware arrangement for computing the imbalance cost function will now be discussed in more detail with reference to FIG. 2 which is a schematic drawing of a hardware arrangement 20 for providing an imbalance cost for a k-way partition. As discussed above, each cell in the PSR 11 includes one cell corresponding to each partition. Each partition's ideal size is assumed to be n/k. Each cell in PSR 11 has connected thereto a k-way decoder. Exemplary decoders are shown at 21–23. The outputs of the decoders are summed in k carry save adders. Exemplary adders are shown at 31–33. The difference between the sum in each adder and the ideal partition size is computed by a difference circuit. The difference circuits corresponding to adders 31–33 are shown at 41–43, respectively. The output of each difference circuit is input to an absolute value circuit. The absolute value circuits corresponding to difference circuits 41–43 are shown at 51–53, respectively. Finally, the outputs of all of the absolute value circuits are computed by carry save adder 60.

Figure 2:
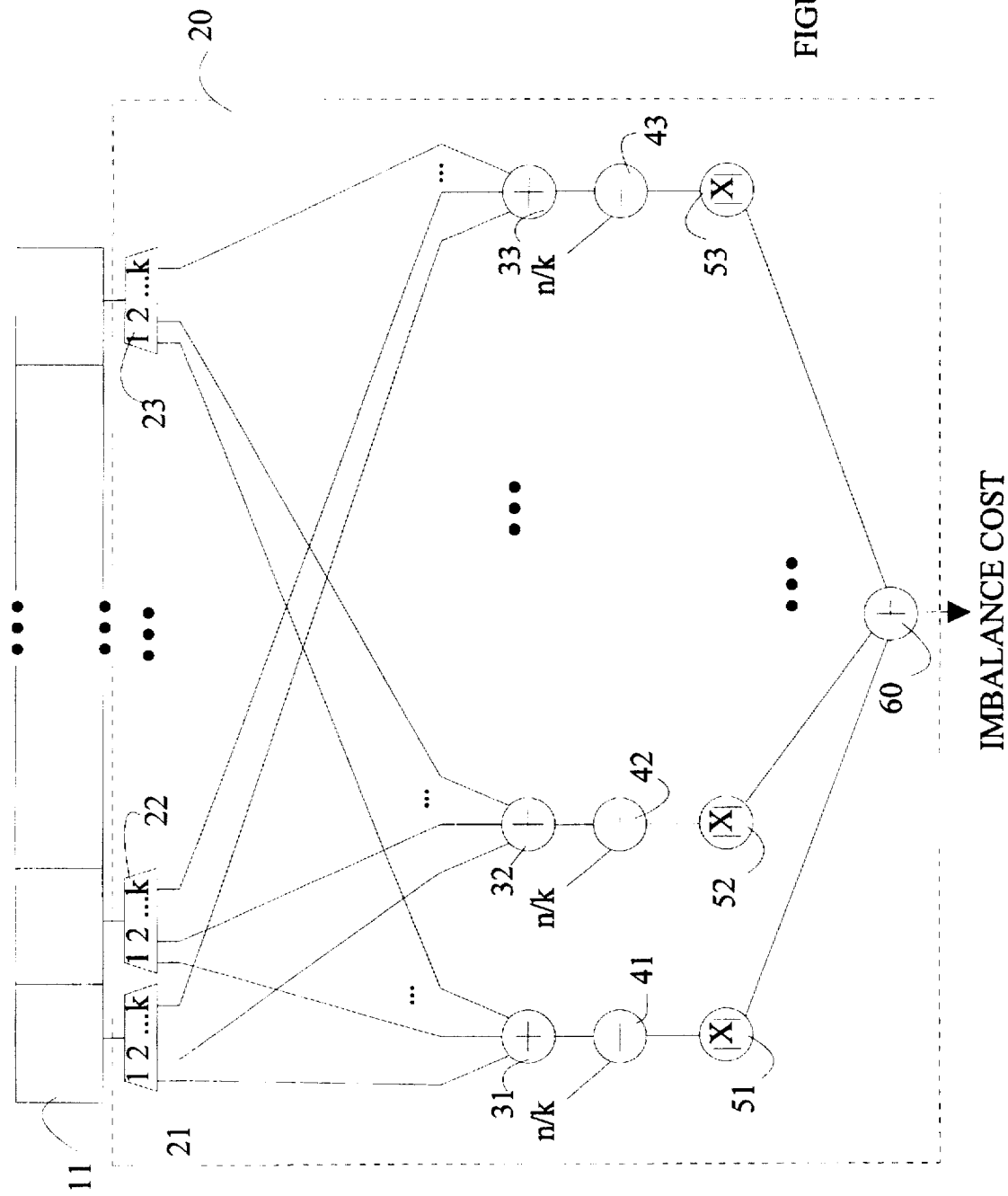
FIG. 2 is a schematic drawing of an imbalance cost calculating circuit according to the present invention.

If k=2, i.e., a bisection of the graph, the decoders shown in FIG. 2 may be eliminated. In this case, only the deviation in size from the ideal is computed for one partition, since the other partition's size deviation will be the same. This approximation can be corrected by multiplying the final result by 2 which is equivalent to changing the relative weights of the two cost components.

The manner in which the trial solutions are generated will now be explained in more detail. Trial solutions are generated by taking the existing PSR and exclusive-ORing it with a partition state change vector which is a vector of equal length. If the change vector contains a 1 in location L, then this operation causes the corresponding bit in the PSR to change. By sparsely populating the change vector with random 1s, the solution space in the neighborhood of the current PSR is searched. The distance between two successive PSR vectors is determined by the number of 1s in the change vector, the distance increasing with an increase in the number of 1s in the change vector. As noted above, the annealing algorithm starts with a large effective distance and then shrinks the distance as the search proceeds. Hence, the algorithm need only control the number of 1s in the change vector.

Figure 3:
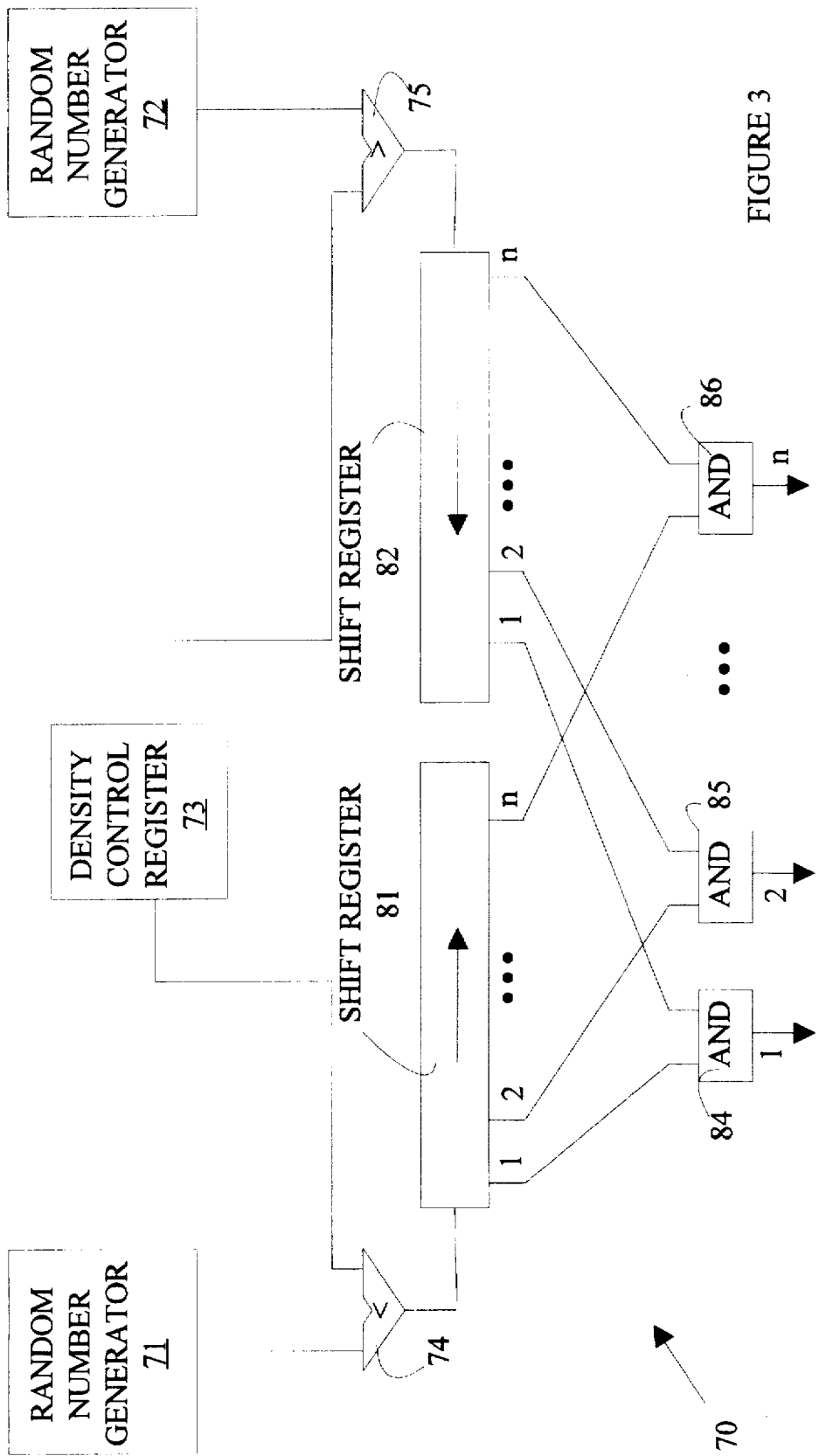
FIG. 3 is a schematic drawing of a circuit for generating a partition change vector according to the present invention.

Refer now to FIG. 3 which is a block diagram of a circuit 70 for generating a partition change vector according to the present invention. Circuit 70 generates the change vector from two n-bit shift registers 81 and 82 with corresponding bits in each register connected to two-input AND gates, there being n such AND gates. Exemplary AND gates are shown at 84–86. Two uncorrelated pulse streams with controllable pulse density are used to feed the two shift registers. One stream is applied to the first shift register 82 which shifts bits from left to right, and the other stream is applied to the second shift register 81 which shifts bits from right to left. Whenever there is a coincidence between two corresponding bits in the two shift registers, a 1 will be generated at the output of the corresponding AND gate. The change vector comprises the output of the AND gates. It can be shown that the density of 1s in the resultant change vector is determined by the product of the pulse densities in the two applied pulse streams.

In the preferred embodiment of the present invention, a pulse stream with a controllable pulse density function, is generated by applying a random number to a digital comparator having a reference value that specifies the pulse density. The random number generator used to feed shift register 81 is shown at 71, and the random number generator used to feed shift register 82 is shown at 72. The corresponding digital comparators are shown at 74 and 75, respectively. The reference inputs of the digital comparators are preferably fed from a common density control register 73. If the random number is less than the reference value, the comparator value will be a 1, if not, it will be 0. This reduces the problem to generating two sequences of random numbers.

It will be apparent to those skilled in the art that one-dimensional arrays of cellular automata can produce sequences of random numbers. Unfortunately, prior art random number generators based on automata generate sequences with symmetrical data patterns. The present invention avoids this problem by utilizing a novel array of automata that includes a modulo sum 2 feedback term to destroy such patterns.

Figure 5:
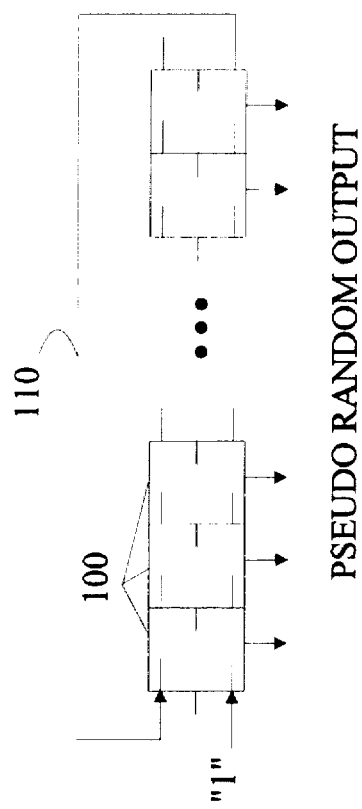
FIG. 5 is a schematic drawing of a random number generator according to the present invention.
Figure 4:
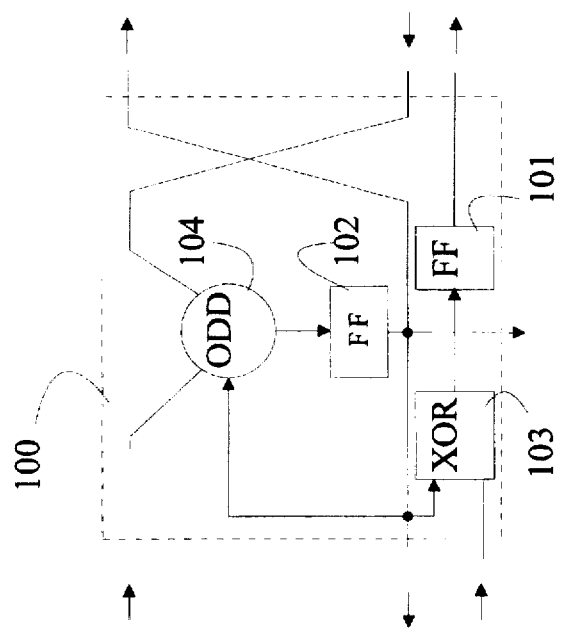
FIG. 4 is a schematic drawing of the basic cell used in an embodiment of a random number generator according to the present invention.

The basic cell used in the random number generator is shown in FIG. 4 at 100. The cell's next state is a function of the cell current state and its left and right neighbors in the linear array. If among the three cells the number of current outputs set to 1 is odd, then the next state of the cell is 1, otherwise, the next state is 0. Such a cell can be constructed from two flip-flops 101 and 102, an XOR gate 103, and a circuit 104 whose output is 1 if either one or three of its inputs are set to logical 1. This type of cell is known to the art. To simplify the drawings, the clock inputs to the flip flops and other logical elements have been omitted. The present invention utilizes a pipelined modulo sum 2 feedback term to break up symmetrical patterns in the array as shown at 110 in FIG. 5. The array is constructed from a plurality of cells connected in series, including a first cell, a last cell, and one or more intermediate cells. The bits of the random number are taken from selected cells within the array that are maximally isolated from one another. Moving the outputs apart from one another in this fashion lessens the correlation between bits.

While the above described algorithm will, in general, find the optimum partition, the time needed to find the optimum can be substantially reduced if the trial solutions are restricted to points on the partition frontiers. Hence, in the preferred embodiment of the present invention, the solution can be so restricted by restricting the partition state change vector so that only vertices on the boundary of the partition are reassigned.

As noted above, trial solutions are generated by changing the partitions assigned to relatively small number of vertices in the graph. In general, this is done by Exclusive ORing, the partition change vector with the current partition state register. Consider the simple case in which the graph is being partitioned into two groups. If the partition change vector contains a 1 in the position corresponding to vertex k, than vertex k will be switched from its current partition assignment to the alternate partition.

Refer now to FIG. 6 which is a schematic drawing of a circuit 200 for masking the bits of the partition change vector that would otherwise lead to a trial solution that was not on the boundary of a partition. Circuit 200 is connected to the PSR 11 and examines the state assignments to determine which vertices are on the edge of partition. A vertex is on the frontier of a partition if it is connected to a vertex in a different partition. Hence, circuit 200 includes an XOR gate for each edge in the graph. Exemplary XOR gates are shown at 212 and 213. The output of an XOR gate will be true if the vertices connected by the corresponding edge are in different partitions.

Circuit 200 also includes an OR gate corresponding to each vertex with one fanin for each edge connected to the corresponding vertex. Exemplary OR gates are shown at 215 and 216. The output of the OR gate corresponding to a vertex will be true if the vertex is on the frontier of a partition. The goal of circuit 200 is to restrict changes in the current PSR contents to moving only vertex assignments for vertices on the frontier. This is accomplished by removing any 1s in the change vector that occur at positions corresponding to vertices that are not on the frontier. Circuit 200 accomplishes this by masking the bits of the change vector corresponding to interior vertices using AND gates such as AND gates 217 and 218. There is one such AND gate for each bit of the change vector.

The above discussion has assumed that the partitioning problem is of order 2, i.e., there are only two partitions. If there are more than two partitions, then the XOR gates shown in FIG. 6 must be replaced by comparators whose output is true if their inputs are not equal. The new change vector will then have a 1 at each vertex location that is to be changed. However, the magnitude of the change is not provided by circuit 200. The new PSR value may be obtained by any of a number of strategies. For example, the change vector bit may be added to the bits in each cell modulo k. Alternatively, the contents of the PSR cell corresponding to a 1 in the change vector may be replaced by a random number between 0 and (k–1).

The performance of the above described system can be further improved by treating hypergraphs differently from other portions of the graph. A hypergraph is a set of vertices and hyperedges. A hyperedge is a subset of two or more vertices. For example, a logic circuit with a gate driving eight other gates is a hypergraph. If hypergraphs are treated as ordinary graphs, they tend to give inflated cutsize costs in the above algorithm. This occurs because one partitioning option might be to have the eight gates in question divided evenly between two partitions leading to eight partition crossings when only one is electrically required.

The present invention avoids this problem by restricting the solutions such that the minimum penalty is charged when the hypergraph is divided between partitions. Consider the simple case of a hypergraph bisectioning. The cutsize should be either one or zero. If all of the vertices are in the same partition, the cutsize is zero. If the vertices are in two different partitions, then the vertices connected by the hyperedge in a given partition can be connected by a common conductor in that partition. Similarly, the vertices in the other partition that are connected by the hyperedge may be connected together. A single conductor is needed between the two partitions to connect the two portions of the hyperedge. Hence, the maximum cutsize should be one.

Figure 7:
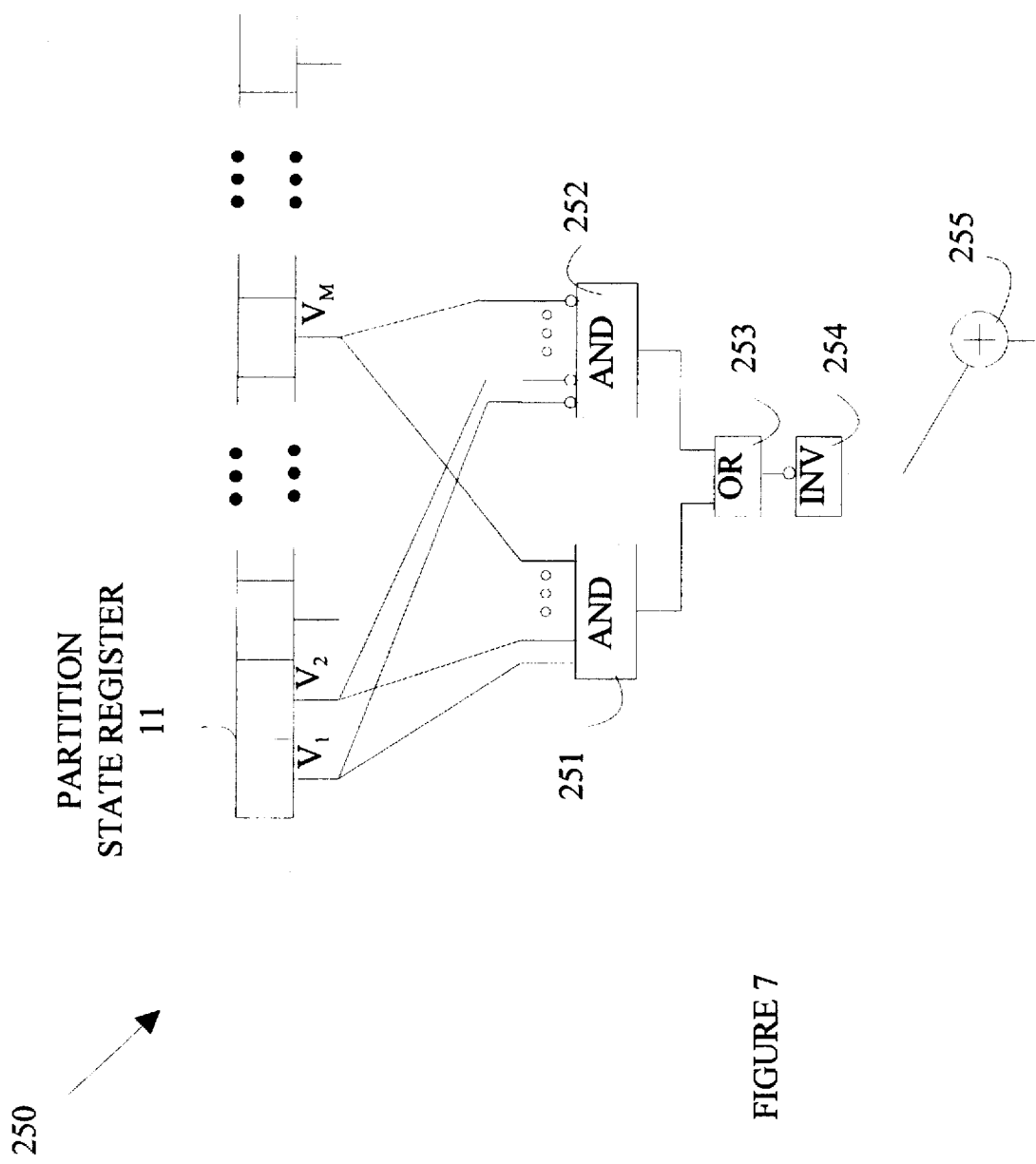
FIG. 7 is a schematic drawing of a circuit according to the present invention for computing the cutsize of a hypergraph in a partitioning problem in which the set of vertices is to be bisected.

In the preferred embodiment of the present invention, the cutsize for hypergraphs are computed using a special hypergraph cutsize circuit. Refer now to FIG. 7 which is a schematic drawing of a hypergraph cost circuit 250 according to the present invention. Consider the case in which vertices $V_1, V_2, \ldots V_M$ are connected by a hyperedge. Then two AND gates, 251 and 252, are connected to PSR 11, each vertex being connected to a corresponding input in each of the AND gates. If the cells in question are all assigned to the same partition, then one of the AND gates will have all of its inputs set to either a 1 or a 0 and the other AND gate will have all of its inputs set to the other state. OR circuit 253 and inverter 254 convert this state to a 0 which is input to the carry save adder 255 used to sum the cutsize. If, on the other hand, one of the vertices are in a different partition, both AND gates will generate a 0 which will be converted by OR 253 and inverter 254 to 1.

Figure 8:
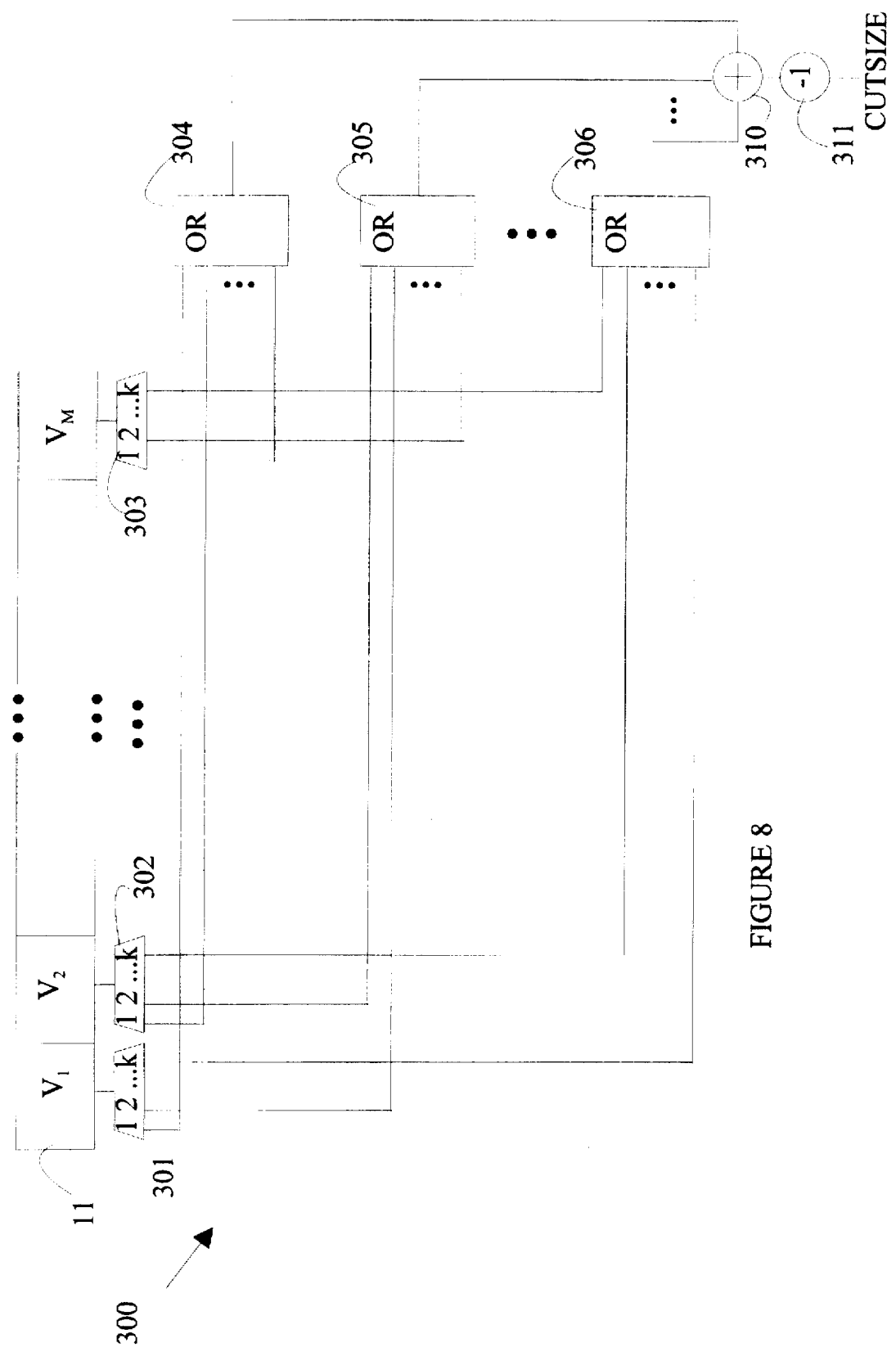
FIG. 8 is a schematic drawing of a circuit according to the present invention for computing the cutsize of a hypergraph in a partitioning problem in which the set of vertices is to be partitioned into k partitions.

The above described embodiment assumed that the partition was to be bisected. In the general case in which the number of partitions is k, the maximum cutsize should be (k–1). A circuit for generating the cutsize for the general partition case is shown in FIG. 8 at 300. In this case, a 1 to k decoder is connected to each cell of PSR 11 corresponding to a vertex connected by the hyperedge. Exemplary decoders are shown at 301–303. The outputs of the M decoders are used as the inputs to M k-input OR gates whose outputs are summed by carry save adder 310. Exemplary OR gates are shown at 304–306. The output of carry save adder 310 is decremented by 1 using decrementer 311 thereby generating the cutsize.

Various modifications to the present invention will become apparent to those skilled in the art from the foregoing description and accompanying drawings. Accordingly, the present invention is to be limited solely by the scope of the following claims.

What is claimed is:

1. In a method for operating a field programmable gate array (FPGA) to compute a function whose optimum represents the partitioning of a graph into a plurality of partitions, said graph comprising a plurality of vertices connected by edges, said partitioning assigning each of said verticies to one of said partitions, the improvement comprising configuring said FPGA to provide:

a partition state register(PSR), comprising a plurality of cells, each cell corresponding to one of said vertices, each cell storing a number indicative of the partition to which said vertex is currently assigned, said PSR representing a partitioning of said graph;

a circuit for computing the sum of the edges that connect vertices in different partitions; and a circuit for computing a value representing the degree to which the partitions are of different sizes.

2. The method of claim 1 wherein the numbers stored in said cells of said PSR are in binary and wherein said method further comprising the step of configuring said FPGA to provide a circuit for generating a state change vector having one bit corresponding to each bit in said PSR, the number of bits having the value 1 in said state change vector being less than half of the total number of said bits in said state change vector, said bits having the value 1 being randomly placed in said state change vector.

3. The method of claim 2 wherein said circuit for generating said state change vector comprises a circuit for masking selected bits in said state change vector such that the partitioning represented by combining said masked state change vector and the contents of said PSR differs from the partitioning represented by said PSR only with respect to vertices that are on the boundary of one of said partitions, a vertex being on the boundary of a partition if said vertex is connected to a vertex in a different partition by an edge of said graph.

4. The method of claim 2 where said step of configuring said FPGA to provide a circuit for generating a state change vector comprises the step of configuring said FPGA to provide a first shift register having an input for receiving a binary value to be shifted through said first shift register, said shift register comprising a plurality of cells through which said received binary value is shifted, each said cell having an output indicative of the value stored in said cell in said shift register, a first random number generating circuit having an output comprising a first sequence of random numbers, and a first comparator for comparing each number in said first sequence of random numbers with a first value, said first comparator having an output connected to the input of said first shift register;

a second shift register having an input for receiving a binary value to be shifted through said second shift register, said shift register comprising a plurality of cells through which said received binary value is shifted, each said cell having an output indicative of the value stored in said cell in said shift register, a second random number generating circuit having an output comprising a second sequence of random numbers, and a second comparator for comparing each number in said second sequence of random numbers with a second value, said second comparator having an output connected to the input of said second shift register; and a circuit, connected to said outputs of corresponding said cells in said first and second shift registers, for generating said change vector.

5. The method of claim 4 wherein one of said random number generating circuits comprises a plurality of cells connected in series, said series comprising a first cell, a last cell, and one or more intermediate cells, each said cell comprising a circuit for storing a binary state and outputting a state value, an output terminal, said cell's next state being a function of the cell's current state and first and second inputs, wherein said intermediate cells are connected such that said first and second inputs of each said intermediate cells are connected, respectively, to said state outputs of said cells on each side of said intermediate cell in said series, and wherein one of said inputs of said first cell is connected to a circuit whose output is the sum of all of said cell states modulo 2.

6. The method of claim 1 wherein at least three vertices in said graph are connected to a hyperedge and wherein said method further comprises configuring said FPGA to provide a circuit connected to said cells in said PSR corresponding to said vertices connected to said hyperedge, said circuit having an output between 0 and k−1, wherein k is the number of partitions into which said graph is to be partitioned, said output of 0 being equal to the number of different values in said cells of said PSR corresponding to said hyperedge connected vertices less one.

7. A circuit for generating a sequence of random numbers, said circuit comprising a plurality of cells connected in series, said series comprising a first cell, a last cell, and one or more intermediate cells, each said cell comprising a circuit for storing a binary state and outputting a state value, and an output terminal, said cell's next state being a function of the cell's current state and first and second inputs, wherein said intermediate cells are connected such that said first and second inputs of each said intermediate cells are connected, respectively, to said state outputs of said cells on each side of said intermediate cell in said series, and wherein one of said inputs of said first cell is connected to a circuit whose output is the sum of all of said cell states modulo 2.

8. A circuit for generating a binary vector having a density of ones determined by a control value, the placement of ones in said binary vector being random, said circuit comprising:

a first shift register having an input for receiving a binary value to be shifted through said first shift register, said shift register comprising a plurality of cells through which said received binary value is shifted, each said cell having an output indicative of the value stored in said cell in said shift register, a first random number generating circuit having an output comprising a first sequence of random numbers, and a first comparator for comparing each number in said first sequence of random numbers with a first value, said first comparator having an output connected to the input of said first shift register;

a second shift register having an input for receiving a binary value to be shifted through said second shift register, said shift register comprising a plurality of cells through which said received binary value is shifted, each said cell having an output indicative of the value stored in said cell in said shift register, a second random number generating circuit having an output comprising a second sequence of random numbers, and a second comparator for comparing each number in said second sequence of random numbers with a second value, said second comparator having an output connected to the input of said second shift register; and a circuit, connected to said outputs of corresponding said cells in said first and second shift registers, for generating the bits of said binary vector.

9. The circuit of claim 8 wherein said circuit for generating said bits of said binary vector comprises a plurality of two bit AND gates, each said AND gate having one input connected to a bit in said first shift register and the other input connected to a bit in said second shift register.

* * * * *